(12) United States Patent
Zhao et al.

(10) Patent No.: US 6,677,168 B1
(45) Date of Patent: Jan. 13, 2004

(54) ANALYSIS OF ION IMPLANT DOSAGE

(75) Inventors: Zhiyong Zhao, Austin, TX (US); Clive Jones, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/135,703

(22) Filed: Apr. 30, 2002

(51) Int. Cl.[7] .............................................. G01R 31/26
(52) U.S. Cl. ......................... 438/14; 438/510; 438/514; 438/517
(58) Field of Search ............................. 438/510, 514, 438/524, 527, 531, 517, 18, 491, 10–11, 17, 14; 324/751–752; 250/492.1, 492.21, 49.3

(56) References Cited

U.S. PATENT DOCUMENTS

| | | | | |
|---|---|---|---|---|
| 5,520,769 A | * | 5/1996 | Barrett et al. ................. | 438/14 |
| 5,637,870 A | * | 6/1997 | Tanigaki ..................... | 250/307 |
| 5,652,151 A | * | 7/1997 | Asada ........................ | 438/18 |
| 5,804,981 A | * | 9/1998 | Lowell et al. ............... | 324/752 |
| 5,825,035 A | * | 10/1998 | Mizumura et al. ........ | 250/423 R |
| 5,900,633 A | * | 5/1999 | Solomon et al. ........ | 250/339.08 |
| 5,999,719 A | * | 12/1999 | Asada et al. ................. | 703/12 |
| 6,064,081 A | * | 5/2000 | Robinson et al. ........... | 257/183 |
| 6,151,119 A | * | 11/2000 | Campion et al. ........... | 356/630 |
| 6,153,444 A | * | 11/2000 | Nakano et al. .............. | 438/16 |
| 6,207,537 B1 | * | 3/2001 | Satoh et al. ................. | 438/510 |
| 6,251,755 B1 | * | 6/2001 | Furukawa et al. .......... | 438/510 |
| 6,281,025 B1 | * | 8/2001 | Ring et al. ................... | 438/10 |
| 6,313,648 B1 | * | 11/2001 | Syo ............................. | 324/719 |
| 6,320,403 B1 | * | 11/2001 | Shabde et al. ............... | 324/766 |
| 6,323,951 B1 | * | 11/2001 | Borden et al. ............... | 356/502 |
| 6,403,452 B1 | * | 6/2002 | Murakoshi et al. ......... | 438/510 |
| 6,569,691 B1 | * | 5/2003 | Jastrzebski et al. ........... | 438/14 |
| 6,586,264 B2 | * | 7/2003 | Usujima ...................... | 438/14 |
| 2002/0139976 A1 | * | 10/2002 | Hembree et al. ............. | 257/48 |

OTHER PUBLICATIONS

D. F. Downey et al.; *Activation and Process Characteristics of Infrared Rapid Isothermal and Furnace Annealing Techniques*—Solid State Technology; all pages; 1982.

Stanley Wolf and Richard N. Tauber, *Silicon Processing for the VLSI Era, vol. 1—Process Technology;* pp. 275–276 and 606–607; 1986.

Jon Opsal et al.; *Physics of Thermal Wave NDE of Semiconductor Materials and Devices*—Materials Research Society; pp. 28–32; Apr. 1988.

Thermawave.com; Thermal Wave (Implant)—http.//www.thermawave.com/technology/thermal.htm; pp. 1–3; Apr. 3, 2002.

* cited by examiner

Primary Examiner—Long Pham
Assistant Examiner—Thao X. Le
(74) Attorney, Agent, or Firm—Timothy M. Honeycut

(57) ABSTRACT

Various methods of determining ion implant dosage are disclosed. In one aspect, a method of processing a semiconductor workpiece that has a device region and an inactive region is provided. A first mask is formed on a first portion of the inactive region. A first implant of ions is performed on the device region and the first mask. A secondary ion mass spectrometry analysis of the first portion of the first mask is performed to determine a composition thereof relative to a standard composition. A dose for the first implant is determined based upon the secondary ion mass spectrometry analysis of the first portion of the first mask. The first implant dose is compared with a prescribed dose for the first implant to determine if a second implant is necessary to achieve the prescribed dose, and if so, an appropriate make-up dose for the second implant.

26 Claims, 5 Drawing Sheets

ANALYSIS OF ION IMPLANT DOSAGE

BACKGROUND OF THE INVENTION

1. Field of the Invention

This invention relates generally to semiconductor processing, and more particularly to methods of determining ion implant dose.

2. Description of the Related Art

Ion implantation is a widely used technique in the fabrication of integrated circuits on semiconductor wafers. Owing to its delivery of faster throughput and more precise placement of dopants, ion implantation has supplanted chemical diffusion in many applications as the preferred method of introducing impurities into films and structures on a semiconductor wafer.

In a general sense, ion implantation involves the placement of a semiconductor wafer in an ion implantation tool where an energetic beam of charged atoms or molecules is directed toward specified locations on the wafer. The implant may be performed across the entire wafer surface non-selectively. More commonly though, the implantation of the ionic species is restricted to certain portions of the substrate. To this end, appropriate masking is applied to the wafer surface prior to the implant.

Ion implanters are among the most complex systems used in the fabrication of integrated circuits on semiconductor wafers. Most conventional ion implanters include an ion source, an i on extraction and analyzing device of some sort, an acceleration tube, and a high vacuum system. The complex choreography for these various systems necessary for successful ion implantation is normally handled by a computer control system, which is designed to automate as many of the phases of the implantation process as possible. The control system is normally tasked with monitoring a large number of parameters to ensure that the implantation proceeds normally.

Despite the wide spread usage of complex control systems and finely tuned ion implanter subsystems, ion implantation processes do not always proceed normally. In many cases, the implant is interrupted or otherwise aborted prior to completion. The reasons for such aborts are legion and include unacceptable deviations in beam current, chamber pressure, beam composition and voltage variations to name just a few.

Characterization of ion implantations must be performed in order to verify implant dose, implant depth profiles and uniformity of implant dose across the surface of the wafer. Accurate post implant characterization is particularly important in circumstances where the implant experiences an abort. In such cases it is vital to determine the dose delivered to the wafer so that the need and specifications for a make-up implant can be determined.

One conventional technique for characterizing partially implanted wafers involves thermal wave analysis. However, thermal wave analysis may not yield an exact dosage. This is because the analysis is based on a plasma wave by laser excitation and does not have a linear relationship between the thermal wave and the implant dose. It is also dependent on the energy and species of implant. Furthermore, thermal wave measurement is of very limited benefit for analyzing implanted substrates that have undergone pre-amorphization implants. Such pre-amorphization implants are common techniques used to condition a substrate in order to establish shallow impurity junctions post implant.

Another conventional technique for characterizing ion implants is secondary ion mass spectrometry ("SIMS"). In conventional SIMS analysis, a small sample of the wafer is clipped is subjected to ion beam sputtering. This technique is destructive when performed on active circuit structures. If performed on a masked structure, the technique may still be destructive and may not provide sufficient sensitivity since the width of the sputtering beam is normally one or more orders of magnitude larger than the widths of mask openings.

Another conventional technique involves the use of x-rays as both the primary scanning beam and the detected entity. However, conventional x-ray fluorescence utilizes a relatively large diameter beam which restricts its use on small features integrated circuits. Furthermore, the penetration of the primary x-ray beam can cause spurious emissions due to surface roughness and depth sensitivity of the detected x-ray signals.

The various limitations of the conventional characterization techniques often translate into the destructive testing of production wafers that may have already undergone substantial processing. Such wafers usually must be scrapped. For those non-destructive techniques, there may be significant limitations with regard to the accuracy of the characterization.

The present invention is directed to overcoming or reducing the effects of one or more of the foregoing disadvantages.

SUMMARY OF THE INVENTION

In accordance with one aspect of the present invention, a method of processing a semiconductor workpiece that has a device region and an inactive region is provided. A first mask is formed on a first portion of the inactive region. A first implant of ions is performed on the device region and the first mask. A secondary ion mass spectrometry analysis of the first portion of the first mask is performed to determine a composition thereof relative to a standard composition. A dose for the first implant is determined based upon the secondary ion mass spectrometry analysis of the first portion of the first mask. The first implant dose is compared with a prescribed dose for the first implant to determine if a second implant is necessary to achieve the prescribed dose, and if so, an appropriate make-up dose for the second implant.

In accordance with another aspect of the present invention, a method of processing a semiconductor workpiece that has an inactive region and a device region with at least one integrated circuit is provided. A first mask is formed on a first portion of the inactive region. A first implant of ions is performed on the least one integrated circuit and the first mask. The existence of an interruption in the first implant is determined. If an interruption in the first implant is detected, a secondary ion mass spectrometry analysis of the first portion of the first mask is performed in order to determine a composition of the first mask relative to a standard composition. A dose for the first implant is determined based upon the secondary ion mass spectrometry analysis of the first portion of the first mask. The first implant dose is compared with a prescribed dose for the first implant to determine if a second implant is necessary to achieve the prescribed dose, and if so, an appropriate make-up dose for the second implant.

In accordance with another aspect of the present invention, a method of processing a semiconductor workpiece that has an inactive region and a device region with at least one integrated circuit is provided. A first mask is formed on a first portion of the inactive region. A first implant of conductivity-altering impurity ions is performed on the at least one integrated circuit and the first mask. The existence of an interruption in the first implant is determined. If an interruption of the first implant is detected, a secondary ion mass spectrometry analysis of the first portion of the first mask is performed in order to determine a depth profile of the conductivity-altering impurity ions relative to a standard depth profile. A dose for the first implant is determined based upon the secondary ion mass spectrometry analysis of the first portion of the first mask. The implant dose is compared with a prescribed dose for the first implant to determine if a second implant is necessary to achieve the prescribed dose, and if so, an appropriate make-up dose for the second implant.

In accordance with another aspect of the present invention, a method of processing a semiconductor workpiece that has a device region and an inactive region is provided. A first mask is formed on a first portion of the inactive region. A first implant of ions is performed on the device region and the first mask. A secondary ion mass spectrometry analysis of the first portion of the first mask is performed to determine a composition thereof relative to a standard composition. A dose for the first implant based upon the secondary ion mass spectrometry analysis of the first portion of the first mask is determined.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
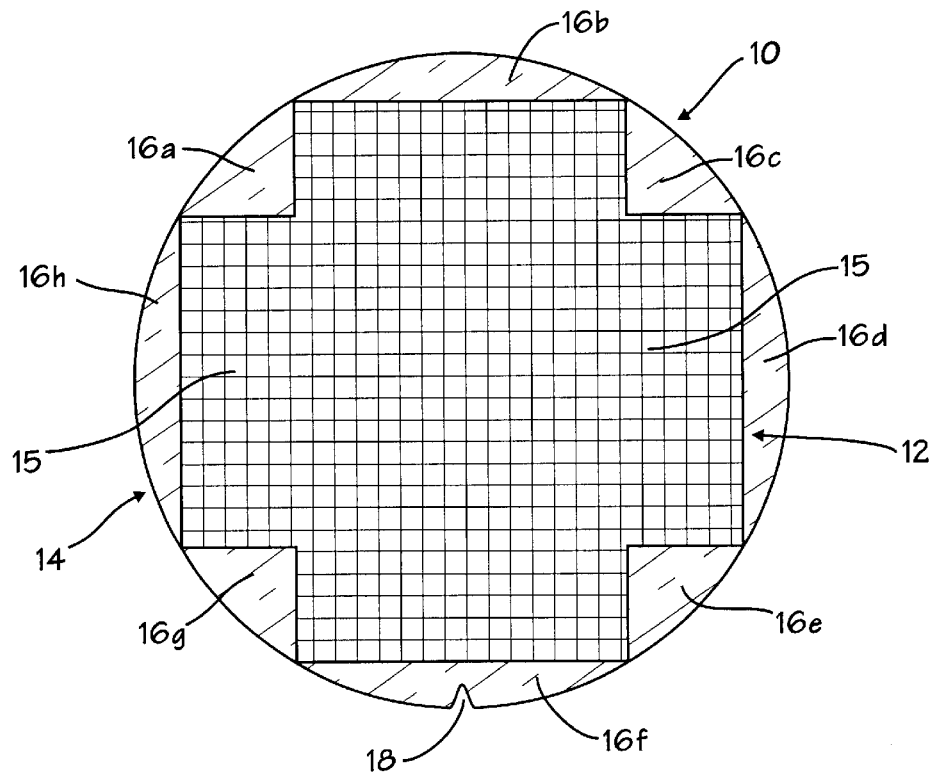
FIG. 1 is a plan view of an exemplary embodiment of a semiconductor wafer or workpiece.

In the drawings described below, reference numerals are generally repeated where identical elements appear in more than one figure. Turning now to the drawings, and in particular to FIG. 1, therein is shown a plan view of an exemplary embodiment of a semiconductor wafer or workpiece 10. The semiconductor workpiece 10 may be composed of p-doped or n-doped silicon, germanium, or other suitable substrate materials. Semiconductor-on-insulator arrangements are envisioned as well, such as silicon-on-insulator or the like. For a variety of manufacturing reasons, it is customarily not possible to utilize the entire surface area of the workpiece 10 for active circuitry. Accordingly, and as shown in FIG. 1, the workpiece 10 includes a device region 12 and an inactive region 14. The device region 12 may consist of one or more circuit devices 15, such as integrated circuits. At a later stage of fabrication, the workpiece 10 may be cut up to separate individual circuit devices 15. The inactive region 14 is identified by the cross-hatching and consists of largely unused portions of the workpiece 10. The cross-hatching in FIG. 1 is not designed to indicate a cross-sectional view as is customary in engineering drawings. Rather, it is used here merely to contrast the unused or inactive regions of the workpiece 10 that are devoid of circuit devices from the device region 12. This is not to say that the inactive region 14 may be completely devoid of circuitry. Indeed, test or other types of circuits may be formed there as necessary.

Conventionally used semiconductor workpieces 10 usually are provided with some type of orientation structure, such as a flat or notch. The exemplary workpiece 10 is provided with a notch 18 as shown.

To illustrate the present invention, the inactive region 14 is subdivided into inactive portions designated 16a, 1b, 16c, 16d, 16e, 16f, 16g and 16h respectively (hereinafter collectively "16a–h"). The skilled artisan will appreciate that the size and configuration of the inactive portions 16a–h and the device region 12 are largely matters of design discretion.

Figure 2:
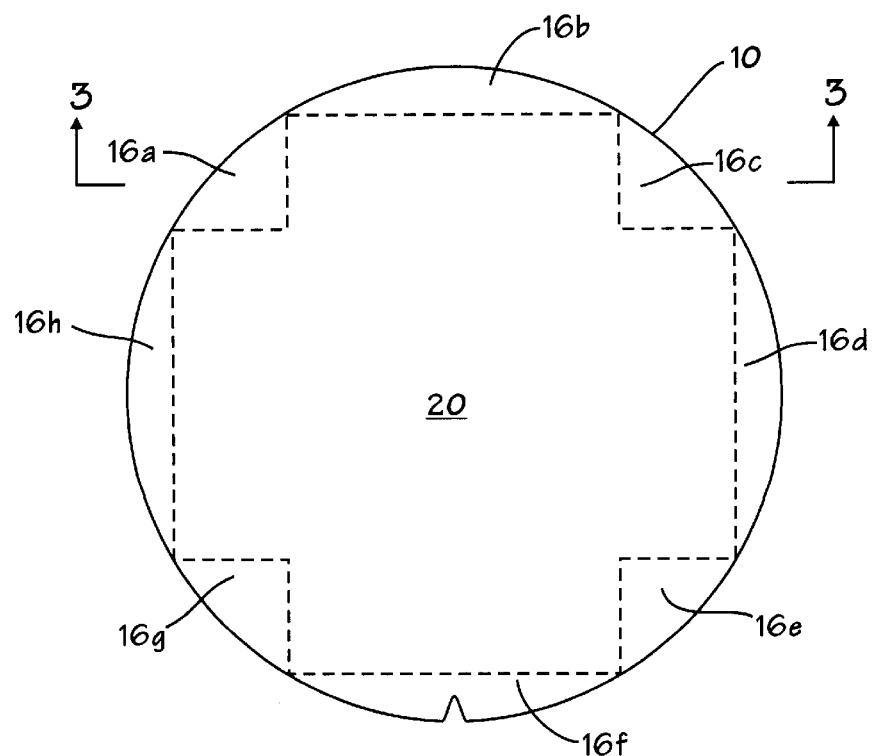
FIG. 2 is a plan view like FIG. 1 showing the application of a mask on the workpiece in accordance with the present invention.

An exemplary method in accordance with the present invention may be understood by referring now to FIGS. 2–9 and initially to FIG. 2. FIG. 2 is a plan view of the semiconductor workpiece. 10 following the application of mask 20 thereon. The mask 20 may be composed of well-known photoresist materials or hard mask materials, such as oxide, nitride, polyimide or the like. In the illustrated embodiment, the mask 20 is composed of photoresist. The underlying device region 12 is covered by the mask 20 and is accordingly shown in phantom.

The fabrication of modern integrated circuits entails the performance of numerous ion implants, many of which require lithographically patterned photoresist masks in order to mask selected portions of the workpiece 10 that are to be shielded from the effects of the ion implantation step. The photoresist mask 20 represents just one of the many possible masks that are applied to the workpiece during semiconductor fabrication.

Figure 3:
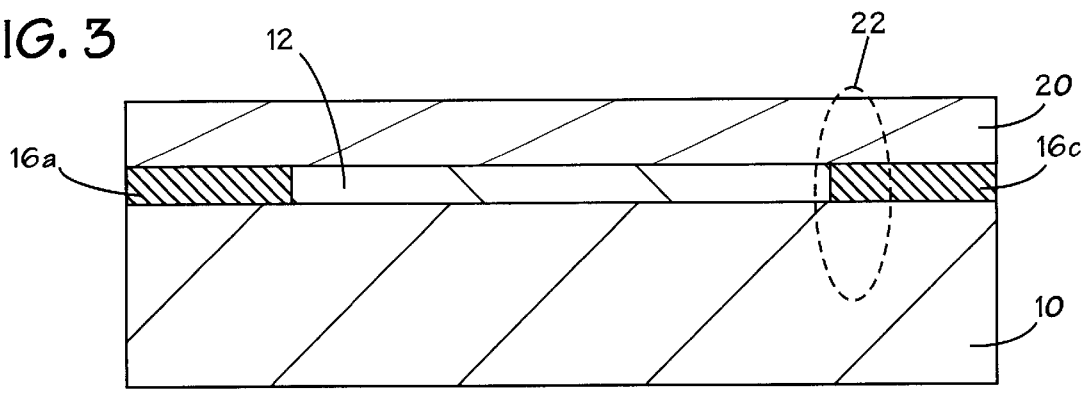
FIG. 3 is a cross-sectional view of FIG. 2 taken at section 3—3 in accordance with the present invention.

A cross-sectional view of the workpiece 10 shown in FIG. 2 and taken at section 3—3 is depicted in FIG. 3. Note that section 3—3 encompasses the inactive portions 16a and 16c of the workpiece 10 as well as the portion of the device region 12 positioned therebetween. The skilled artisan will appreciate that the depictions in FIG. 3 of the inactive regions 16a and 16c as well as the portion of the device region 12 positioned therebetween are schematic in nature in that the scale of FIG. 3 is such that the huge numbers of microelectronic structures in the device region 12 will not be visible.

Figure 4:
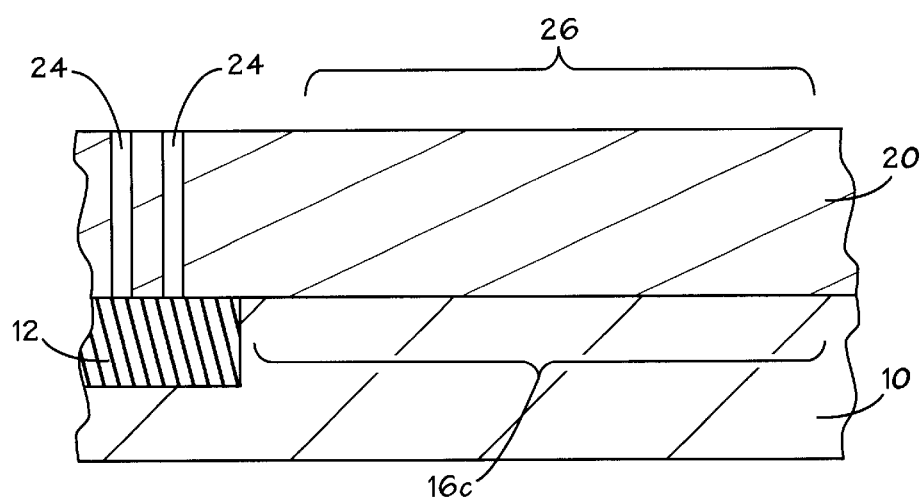
FIG. 4 is a magnified cross-sectional view of a selected portion of FIG. 3 in accordance with the present invention.

The portions of the workpiece 10, including the device region 12 and the inactive regions 16c, and the overlying mask 20 circumscribed by the dashed oval 22 are shown in finer detail in FIG. 4. As shown in FIG. 4, the mask 20 maybe patterned with a plurality of openings 24 that are sized and shaped to allow subsequently implanted ions to pass unimpeded into the various structures of the device region 12. The openings 24 are not drawn to scale relative to the remainder of FIG. 4. This is so because the size of the openings 24 are usually minute relative to the size of, for example, the inactive portion 16c.

As in FIG. 3, the portion of the device region 12 depicted is shown schematically for simplicity of illustration. In accordance with the present invention, the portion 26 of the mask 20 that lies over the inactive portion 16c of the workpiece 10 is utilized for post implant SIMS analysis as a means of determining an implant dosage. Indeed, any or all of the mask 20 overlying the inactive regions 16a–h may be used alone or in concert in order to perform the post implant SIMS analysis as set forth below.

Figure 5:
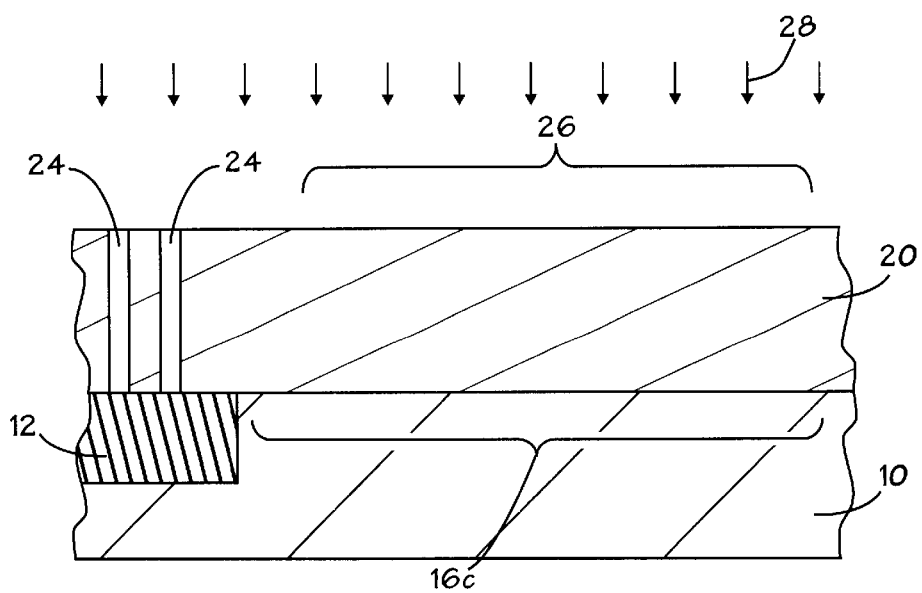
FIG. 5 is a cross-sectional view like FIG. 4 depicting the implantation of ions in accordance with the present invention.

Referring now to FIG. 5, an implant of ions 28 is performed at a prescribed dosage. The implant may be performed for any of myriad of reasons suitable for integrated circuit fabrication. Examples of such are legion and include source/drain impurity implants, threshold voltage control implants, polysilicon gate pre-doping, and halo formation to name just a few. In order to illustrate the benefits of the present invention, it is assumed that the implant of the ions 28 is interrupted or otherwise aborted. Thus, the device region 12 receives only a partial dose. However, the portion 26 of the mask 20also receives the same partial dose. To quantify the partial dose received by the device region 12, and thus determine an appropriate make-up dose for a make-up implantation step, the workpiece 10 undergoes SIMS analysis in accordance with the present invention.

Figure 6:
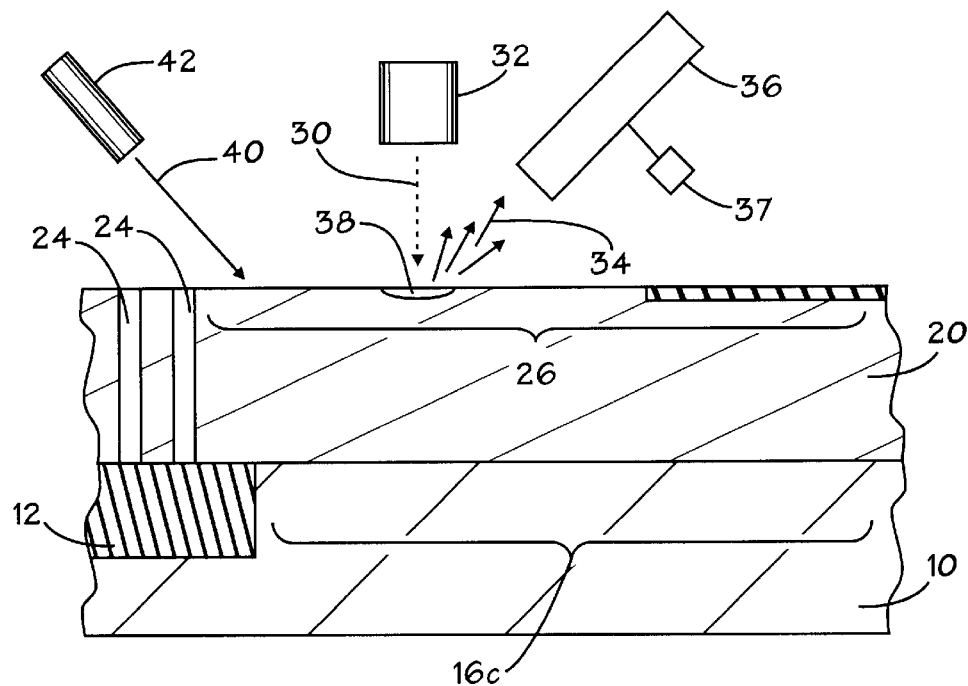
FIG. 6 is a cross-sectional view like FIG. 5 depicting the SIMS analysis of a selected portion of the mask on the workpiece in accordance with the present invention.

The SIMS analysis may be understood by referring now to FIG. 6. A primary ion sputtering beam 30 is directed from a beam source 32 to a target area within the portion 26 of the mask 20 that overlies the inactive region 16c of the workpiece 10. The primary ion beam 30 sputters away secondary ions 34, which are detected by a SIMS analyzer 36 that is provided with a computer system 37. The sputtering produces a crater 38 in the upper surface of the mask 20. The composition of the primary beam 30 is dependent upon the implanted species to be detected. For example, $Cs^+$ ions are appropriate to detect arsenic, phosphorous, oxygen and hydrogen for example. Conversely, $O_2^+$ or $O^-$ ions are suitable ions for detecting boron. The width of the primary beam 30 is largely a matter of design discretion. The size of the crater 38 will depend upon the width of the primary beam 30, the energy of the primary beam 30 and the duration of the sputtering.

The energy selected for the primary beam 30 will depend on a variety of factors, such as the energy for the ion implantation, the composition of the mask 20, and the ionic species chosen for the beam 30. However, a useful rule of thumb is to select the energy for the primary beam 30 to be less than or equal to half the energy used to perform the ion implantation. In an exemplary embodiment, the energy for the primary beam 30 may be about 1 to 5 keV, the beam current may be about 10 to 100 nano amps, the raster scan size may be about 200 by 200 $\mu$m to 400 by 400 $\mu$m, and the sample holder bias may be about +/−80 to 120 V.

In order to lessen the undesirable effects of surface charging of the mask 20 during the SIMS analysis, a charged neutralization agent 40 may be introduced to the surface of the mask 20 by a source 42. The neutralization agent 40 may be, for example, an electron beam for neutralizing a build-up of positive charge. Optionally, negative or positive charge dissipation may be provided by forming a conductor 43 on the mask 20. The conductor 43 is coupled to a sample or wafer holder(not shown). The sample holder is held at a fixed voltage. Charge building up on the mask 20 flows from the conductor 43 and dissipates into the sample holder. The conductor 43 may be fabricated from a variety of conducting materials, such as, for example, aluminum, gold, platinum, cobalt, chromium, mixtures of these or the like. Well-known techniques, such as, for example, focused ion beam sputtering, conventional physical vapor deposition or the like may be used.

Figure 7:
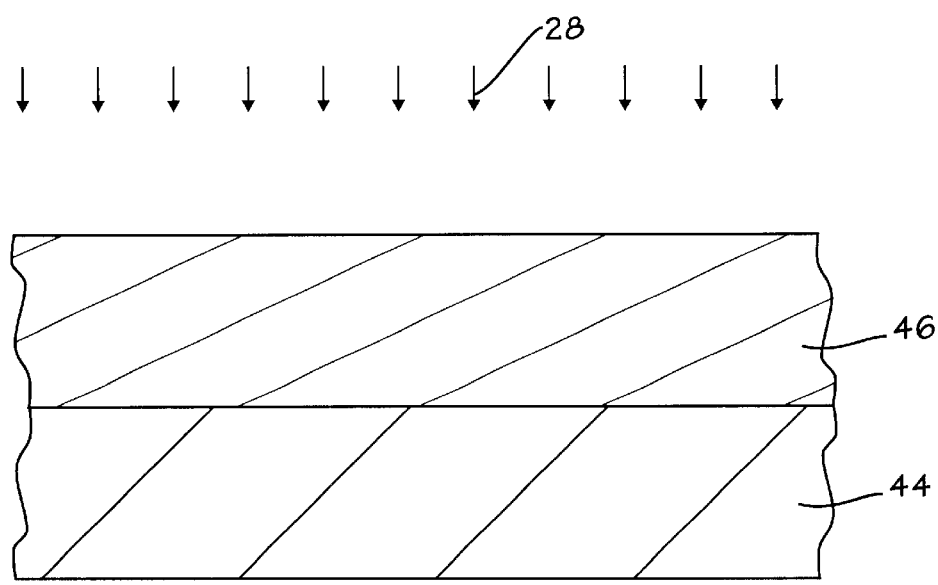
FIG. 7 is a cross-sectional view of the same general scale as FIG. 5 and depicts an implantation of ions in order to establish an external SIMS analysis standard in accordance with the present invention.
Figure 8:
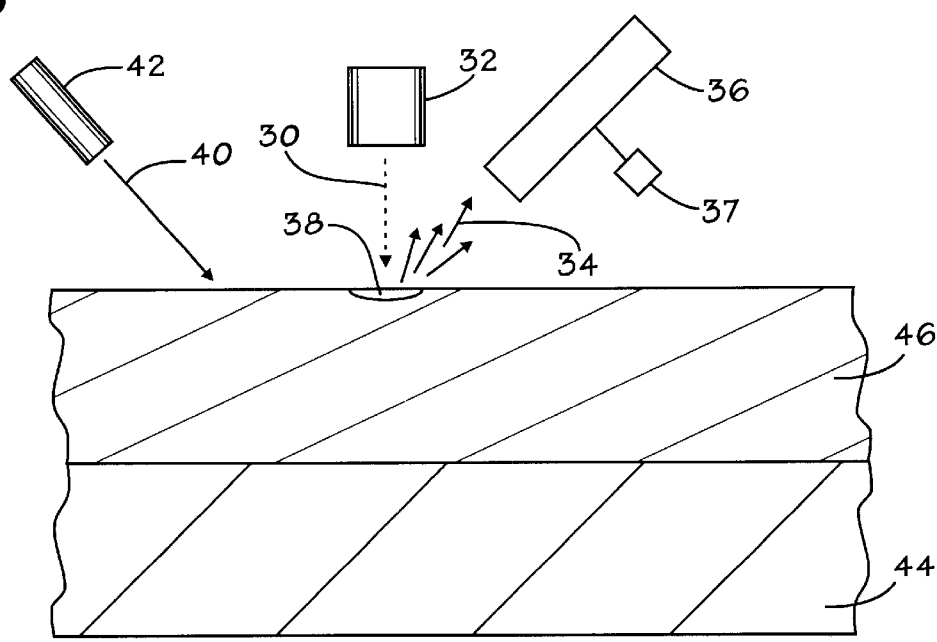
FIG. 8 is a cross-sectional view like FIG. 7 depicting SIMS analysis of the external standard workpiece in accordance with the present invention.

SIMS analysis is a relative measurement in that the composition of a particular film is determined relative to some standard composition. Accordingly, it is desirable to provide a standard against which the analysis of the composition of the secondary ions 34 may be measured. A straightforward solution to the problem of providing an external standard is to coat a test workpiece 44 as shown in FIG. 7 with a mask 46 composed of the same mask material that is used to fabricate the mask 20 shown in FIG. 6, and thereafter perform an implant of the ions 28 at a prescribed dose for an ion implantation without an interruption or abort. The test workpiece 44 may then undergo SIMS analysis as shown in FIG. 8 and as generally described above in conjunction with FIG. 6. Note, however, that since the test workpiece 44 is devoid of circuit structures that might be damaged by the sputtering beam 30, the location of the crater 38 produced by the bombardment of the primary beam 30 and the subsequent sputtering of secondary ions 34 may be formed virtually anywhere on the mask 46.

The secondary ions 34 are detected and analyzed by the SIMS analyzer 36 and from that analysis, an external standard for the full implant dosage is determined. This standard is then compared with the composition computed from the SIMS analysis of the mask 20 depicted in FIG. 6. The composition may be computed as a depth profile or other data set as desired. The comparison may be made by the computer system 37 of the SIMS analyzer 36.

Optionally, an internal standard may be used. Optionally and internal standard may be used. In an exemplary embodiment, the internal standard would take the form of a relative sensitivity factor (RSF). After numerous analyses of an external standard an RSF may be determined whereby, for a given set of SIMS analytical parameters such as primary beam current, primary beam energy, primary beam raster size, sample holder bias voltage and the like, the relative ion yield of an implanted ion species to a matrix ion species may be precisely determined. The SIMS analysis would proceed according to a given recipe and the RSF then applied to calculate the precise implanted dosage.

Figure 9:
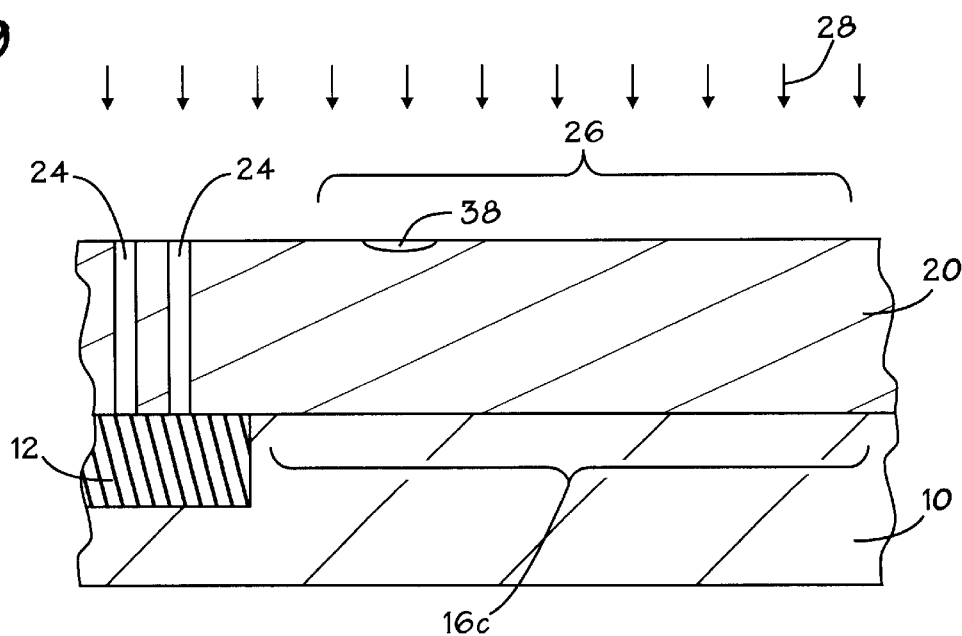
FIG. 9 is a cross-sectional view like FIG. 5 depicting a second implant of ions at a make-up dose in accordance with the present invention.

From the comparison of the compositions of the implanted mask 20 and the standard, a make-up dose is determined. With the make-up dose in hand, the workpiece 10 may undergo another implant of the impurity ions 28 at the make-up dose as shown in FIG. 9. The skilled artisan will appreciate that the ions 28 will usually, though not necessarily, be conductivity-altering impurities, such as arsenic, indium, boron, phosphorus or the like. However, neutrals, such as germanium, silicon or the like may be used as necessary.

The SIMS analysis necessarily involves some scattering of sputter debris in the SIMS chamber. This debris may settle on other areas of the workpiece. Accordingly, a cleaning process may be performed prior to the follow on implant. Well known solvent clean processes may be used.

Because the method of the present invention utilizes portions of the mask 20 external to the device region 12 for SIMS analysis, there are no lasting deleterious effects on the workpiece 10, other than the formation of the crater 38 in the portion 26 of the mask 20. Even if the SIMS analysis somehow perforates the mask 20, the device region 12 would remain unharmed since the method of the present invention provides for SIMS analysis only in the inactive regions 16a–h including the region 16c shown in FIG. 9.

With the make-up implant complete, the workpiece 10 may undergo further processing as necessary to complete the fabrication of the circuit devices 15. Depending upon the point in the process flow where the SIMS analysis is performed, this further processing may include steps such as, for example, fabrication of interconnect structures, inter-level dielectric layers, additional implants or etches, to name just a few.

Figure 10:
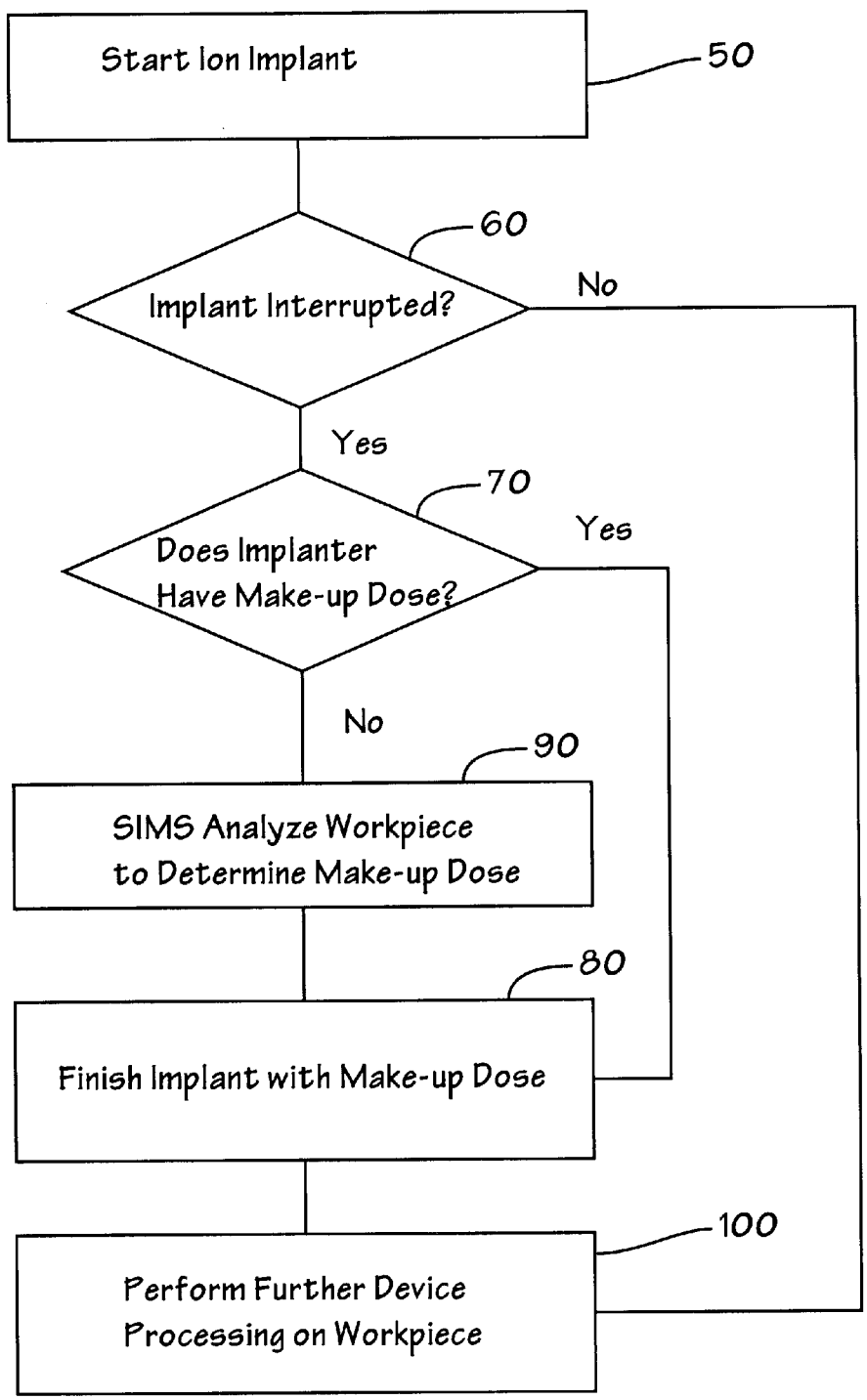
FIG. 10 is a flow chart depicting an exemplary method in accordance with the present invention.

The method is represented schematically in a flowchart in FIG. 10. At step 50, the ion implantation is started as generally described above and depicted in FIG. 5. If the implant is interrupted or otherwise aborted at 60, and the implantation tool is already provided with an appropriate make-up dose at 70, then the implant is finished with the appropriate make-up dose at 80. However, if the implanter does not currently have the appropriate make-up dose at 70, then a SIMS analysis as described elsewhere herein and depicted in FIGS. 6, 7 and 8 is performed at 90, and then the implant with the make-up dose is performed at 80. The workpiece may then undergo further processing as appropriate at 100. Note that if there is no interruption of the implant at 60, then the workpiece may proceed to further processing at 100.

In the foregoing illustrative embodiments, SIMS analysis is performed in accordance with the present invention for the purpose of determining the need and specifications for a make-up implant dose. However, the skilled artisan will appreciate that the invention may be applied to other contexts. For example, the method may be advantageously applied to the determination of the implant dosage of species where no abort has occurred and where conventional SIMS analysis cannot adequately discriminate between matrix ions, i.e., ions of the substrate, and implanted ions. The implantation of silicon ions into a silicon substrate and the implantation of germanium ions into a germanium substrate represent two such examples. Conventional SIMS analysis of an implanted portion of the substrate will not yield useful information about the dosage of the silicon or germanium implants. However, the method as described herein may be used to determine the dosage of implants of species X into a substrate composed of material X. Referring again to FIGS. 5 and 6, an implant of silicon ions 28 into both the mask 20 and the silicon device region 12 may be performed without an abort. Thereafter, a SIMS analysis of the portion of the mask 20 may be performed as described elsewhere herein to determine the dosage of the silicon ions 28 delivered to the silicon device region 12.

Another advantage of the present invention is the capability to perform SIMS analysis of elements which would have a mass interference with the matrix or substrate element or elements. For example, the major isotope of iron has an atomic mass of about 56 amu. This sum is twice the approximate atomic mass of 28 amu for the major isotope of silicon. Consequently the silicon dimer at mass 56 amu interferes with the proper ability to make a SIMS measurement of iron in a silicon matrix using conventional techniques. While iron is not normally implanted deliberately, iron ions may nevertheless make their way into the ion beam. Thus, the present invention provides for dosage determination for multiple implanted species.

Another example of mass interference is the measurement of silicon used as a dopant in gallium nitride (GaN) for the manufacture of blue diodes. Nitrogen has a major isotope of mass about 14 amu, half that of silicon. Accordingly, the N dimer interferes with the proper ability to make a SIMS measurement of Si in a GaN matrix. In still another example, phosphorus with an atomic mass of about 31 amu may be hard to detect in silicon. Silicon has an abundant isotope of mass 30 amu. Hydrogen, which is hard to pump efficiently and is omnipresent in vacuum systems, can combine with the $^{30}$Si isotope to form a mass interference with phosphorus at mass 31 amu. The present invention allows the SIMS measurement of the mass interfering species of the type described above.

The skilled artisan will appreciate that the method in accordance with the present invention provides for implant dose determination without resort to destructive inspection techniques. Masking of inactive portions of a workpiece is used for post implant SIMS analysis. From that analysis, actual implant dose may be determined. This is useful in both successful and aborted implants as a means of verifying implant dose. Workpieces that have undergone substantial and costly processing may be subjected to make-up implants and returned to the processing line instead of going to scrap.

While the invention may be susceptible to various modifications and alternative forms, specific embodiments have been shown by way of example in the drawings and have been described in detail herein. However, it should be understood that the invention is not intended to be limited to the particular forms disclosed Rather, the invention is to cover all modifications, equivalents and alternatives falling within the spirit and scope of the invention as defined by the following appended claims.

What is claimed is:

1. A method of processing a semiconductor workpiece having a device region and an inactive region, comprising:
   forming a first mask on a first portion of the inactive region;
   performing a first implant of ions on the device region and the first mask;
   performing a secondary ion mass spectrometry analysis of the first portion of the first mask to determine a composition thereof relative to a standard composition;
   determining a dose for the first implant based upon the secondary ion mass spectrometry analysis of the first portion of the first mask; and
   comparing the implant dose with a prescribed dose for the first implant to determine if a second implant is necessary to achieve the prescribed dose, and if so, an appropriate make-up dose for the second implant.

2. The method of claim 1, wherein the forming of the first mask comprises forming a photoresist mask.

3. The method of claim 2, wherein the forming of the photoresist mask comprises forming a pattern on the device region wherein selected portions thereof are masked during the first implant.

4. The method of claim 1, wherein the standard composition comprises an external standard.

5. The method of claim 4, wherein the external standard comprises a workpiece with a second mask thereon of the same material as the first mask and implanted with the ions at the prescribed dose.

6. The method of claim 1, wherein the comparison of the first implant dose with a prescribed dose for the first implant is performed by a computer.

7. The method of claim 1, comprising performing the second implant at the make-up dose.

8. The method of claim 7, comprising performing an additional process step on the semiconductor workpiece after the second implant.

9. The method of claim 1, comprising cleaning the semiconductor workpiece after the secondary ion mass spectrometry analysis.

10. A method of processing a semiconductor workpiece having an inactive region and a device region with at least one integrated circuit, comprising:
   forming a first mask on a first portion of the inactive region;
   performing a first implant of ions on the least one integrated circuit and the first mask;
   determining if an interruption occurred in the first implant;
   performing a secondary ion mass spectrometry analysis of the first portion of the first mask if an interruption in the first implant occurred in order to determine a composition of the first mask relative to a standard composition;
   determining a dose for the first implant based upon the secondary ion mass spectrometry analysis of the first portion of the first mask; and
   comparing the first implant dose with a prescribed dose for the first implant to determine if a second implant is necessary to achieve the prescribed dose, and if so, an appropriate make-up dose for the second implant.

11. The method of claim 10, wherein the forming of the first mask comprises forming a photoresist mask.

12. The method of claim 11, wherein the forming of the photoresist mask comprises forming a pattern on the device region wherein selected portions thereof are masked during the implant.

13. The method of claim 10, wherein the standard composition comprises an external standard.

14. The method of claim 13, wherein the external standard comprises a workpiece with a second mask thereon of the same material as the first mask and implanted with the ions at the prescribed dose.

15. The method of claim 10, wherein the comparison of the first implant dose with a prescribed dose for the first implant is performed by a computer.

16. The method of claim 10, comprising performing the second implant at the make-up dose.

17. The method of claim 16, comprising performing an additional process step on the semiconductor workpiece after the second implant.

18. The method of claim 10, comprising cleaning the semiconductor workpiece after the secondary ion mass spectrometry analysis.

19. A method of processing a semiconductor workpiece having a device region and an inactive region, comprising:
   forming a first mask on a first portion of the inactive region;
   performing a first implant of ions on the device region and the first mask;
   performing a secondary ion mass spectrometry analysis of the first portion of the first mask to determine a composition thereof relative to a standard composition; and
   determining a dose for the first implant based upon the secondary ion mass spectrometry analysis of the first portion of the first mask.

20. The method of claim 19, wherein the first implant of ions comprises multiple species, the determining a dose for the first implant, comprising determining a dose for each of the multiple species.

21. The method of claim 19, wherein the forming of the first mask comprises forming a photoresist mask.

22. The method of claim 21, wherein the forming of the photoresist mask comprises forming a pattern on the device region wherein selected portions thereof are masked during the implant.

23. The method of claim 19, wherein the standard composition comprises an external standard.

24. The method of claim 23, wherein the external standard comprises a workpiece with a second mask thereon of the same material as the first mask and implanted with the ions at the prescribed dose.

25. The method of claim 19, comprising performing an additional process step on the semiconductor workpiece after the determining of the implant dose.

26. The method of claim 19, comprising cleaning the semiconductor workpiece after the secondary ion mass spectrometry analysis.

* * * * *